(12) United States Patent
Greenbaum et al.

(10) Patent No.: US 12,463,121 B2
(45) Date of Patent: Nov. 4, 2025

(54) STRUCTURE TO TRANSITION BETWEEN A TRANSMISSION LINE CONDUCTOR AND A SOLDER BALL

(71) Applicant: Intel Corporation, Santa Clara, CA (US)

(72) Inventors: Ariel Greenbaum, Petah Tikva (IL); Matan Pessach, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 803 days.

(21) Appl. No.: 17/558,287

(22) Filed: Dec. 21, 2021

(65) Prior Publication Data

US 2023/0197588 A1    Jun. 22, 2023

(51) Int. Cl.
    *H01L 23/498*   (2006.01)
    *G01S 7/03*     (2006.01)
    *H01L 23/66*    (2006.01)
    *H05K 1/18*     (2006.01)

(52) U.S. Cl.
    CPC ........ *H01L 23/49811* (2013.01); *G01S 7/032* (2013.01); *H01L 23/66* (2013.01); *H05K 1/181* (2013.01); *H01L 2223/6605* (2013.01); *H01L 2223/6677* (2013.01)

(58) Field of Classification Search
    CPC .............. H01L 23/49811; H01L 23/66; H01L 2223/6605; H01L 2223/6677; H01L 2223/6633; H01L 23/49833; H01L 23/49822; H01L 2223/6616; H01L 2223/6627; G01S 7/032; G01S 13/931; H05K 1/181; H05K 1/0243; H05K 1/025; H05K 1/0251; H05K 3/3436; H01P 1/047; H01P 5/085
    See application file for complete search history.

(56) References Cited

U.S. PATENT DOCUMENTS

2020/0137884 A1    4/2020  Markish et al.
2022/0375885 A1*  11/2022  Legendre ............... H05K 1/181
2022/0407204 A1*  12/2022  Goebel .................. H01P 5/107

* cited by examiner

*Primary Examiner* — Seung H Lee
(74) *Attorney, Agent, or Firm* — Compass IP Law PC (57) ABSTRACT

An apparatus is described. The apparatus includes a semiconductor chip package substrate having a transmission line. The transmission line has a conductor to conduct current of a signal that is propagated along the transmission line. The conductor has an expanding width as the conductor approaches a vertical transition region. The vertical transition region is between the conductor and a solder ball. The transition region has multiple conducting vias at a same layer of the substrate. The multiple conducting vias are electrically connected to the conductor. The multiple conducting vias are radially arranged around a center axis of the solder ball.

20 Claims, 10 Drawing Sheets

Fig. 7

STRUCTURE TO TRANSITION BETWEEN A TRANSMISSION LINE CONDUCTOR AND A SOLDER BALL

FIELD OF INVENTION

The field of invention pertains generally to the electronic arts, and, more specifically, to an improved structure to transition between a transmission line conductor and a solder ball.

BACKGROUND

Continued advancements in semiconductor chip manufacturing technology have permitted large scale information processing systems to be integrated at affordable prices into every day commodity products (such as automobiles). The integration of large scale information processing systems into commodity products can raise packaging challenges because the high frequency signals that such systems depend upon can be easily corrupted/distorted.

FIGURES

A better understanding of the present invention can be obtained from the following detailed description in conjunction with the following drawings, in which.

DETAILED DESCRIPTION

Radio Frequency (RF) circuits propagate signals having wavelengths that are comparable to the dimensions of the circuit structures themselves. Because of the challenges associated with this particular environment, RF design engineers employ special signal lines, referred to as transmission lines, to ensure the integrity of the signals that are propagated by their circuits.

Figure 1:
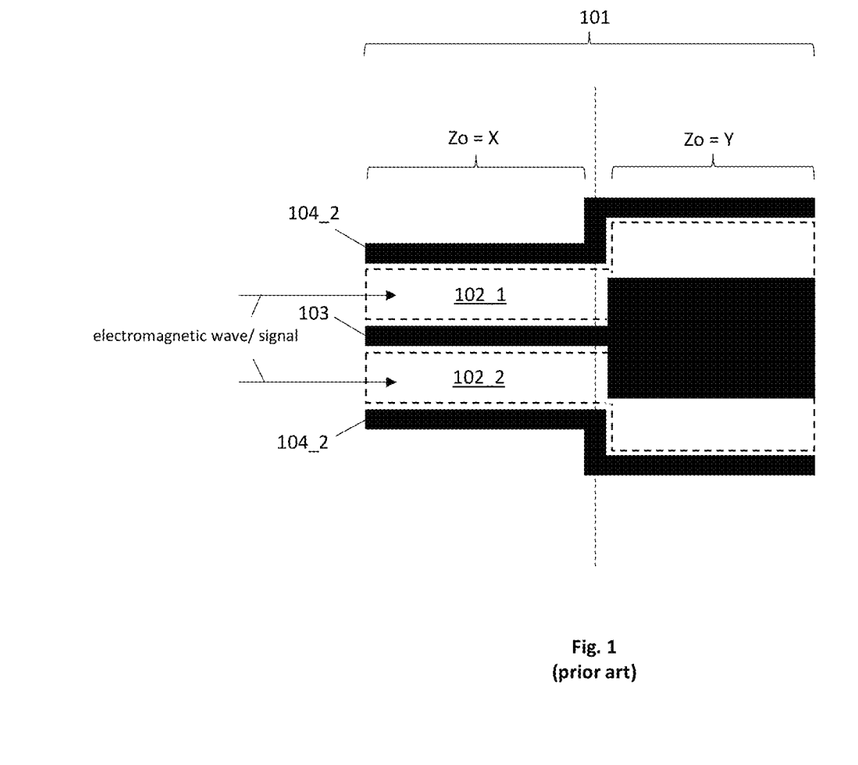
FIG. 1 shows a transmission line.

FIG. 1 shows a particular transmission line 101 referred to as a coplanar micro-strip transmission line. With a coplanar micro-strip transmission line, the signal is an electromagnetic wave that propagates in dielectric media $102\_1$, $102\_2$ on either side of a central conductor 103. The dielectric media $102\_1$, $102\_2$ are each between the central conductor 103 and a respective, outer "ground" conductor $104\_1$, $104\_2$.

The electric field components of the wave induce electric charges on the central conductor 103 as a function of the transmission line's three dimensional structure of conductors 103, $104\_1$, $104\_2$ and dielectric material $102\_1$, $102\_2$. As such, the transmission line is said to have a particular "characteristic impedance" that is determined from its three dimensional structure. The three dimensional structure of the transmission line 101 of FIG. 1, is observed to abruptly change from a first structure having a first characteristic impedance (Zo=X) on the left hand side of FIG. 1 to a second structure having a second characteristic impedance (Zo=Y) on the right hand side of FIG. 1.

As the wave propagates along the transmission line 101 from left to right, the characteristic impedance is constant (Zo=X) which reflects the fixed structure of the left hand side of the transmission line 101 as observed in FIG. 1. When the structure abruptly changes to a different structure on the right hand side having different characteristic impedance (Zo=Y), the amount of charge induced on the central conductor 103 by the signal will abruptly change.

Abrupt changes in characteristic impedance, such as the abrupt change observed in FIG. 1, results in the creation of "reflections" which can cause less signal energy than was originally launched onto the transmission line 101 to reach its load/destination.

In the case of an RF circuit that sends a signal to be transmitted to a radio antenna, or, an RF circuit that processes (e.g., amplifies) the inbound signal received by an antenna, reflections from abrupt impedance changes ("impedance mismatches") can be particularly troublesome. Particularly, the "range" or "link budget" of the wireless communication can be diminished because, in the case of transmission, less signal energy will be launched from the antennae, or, in the case of reception, the received signal will be weaker.

Figure 2:
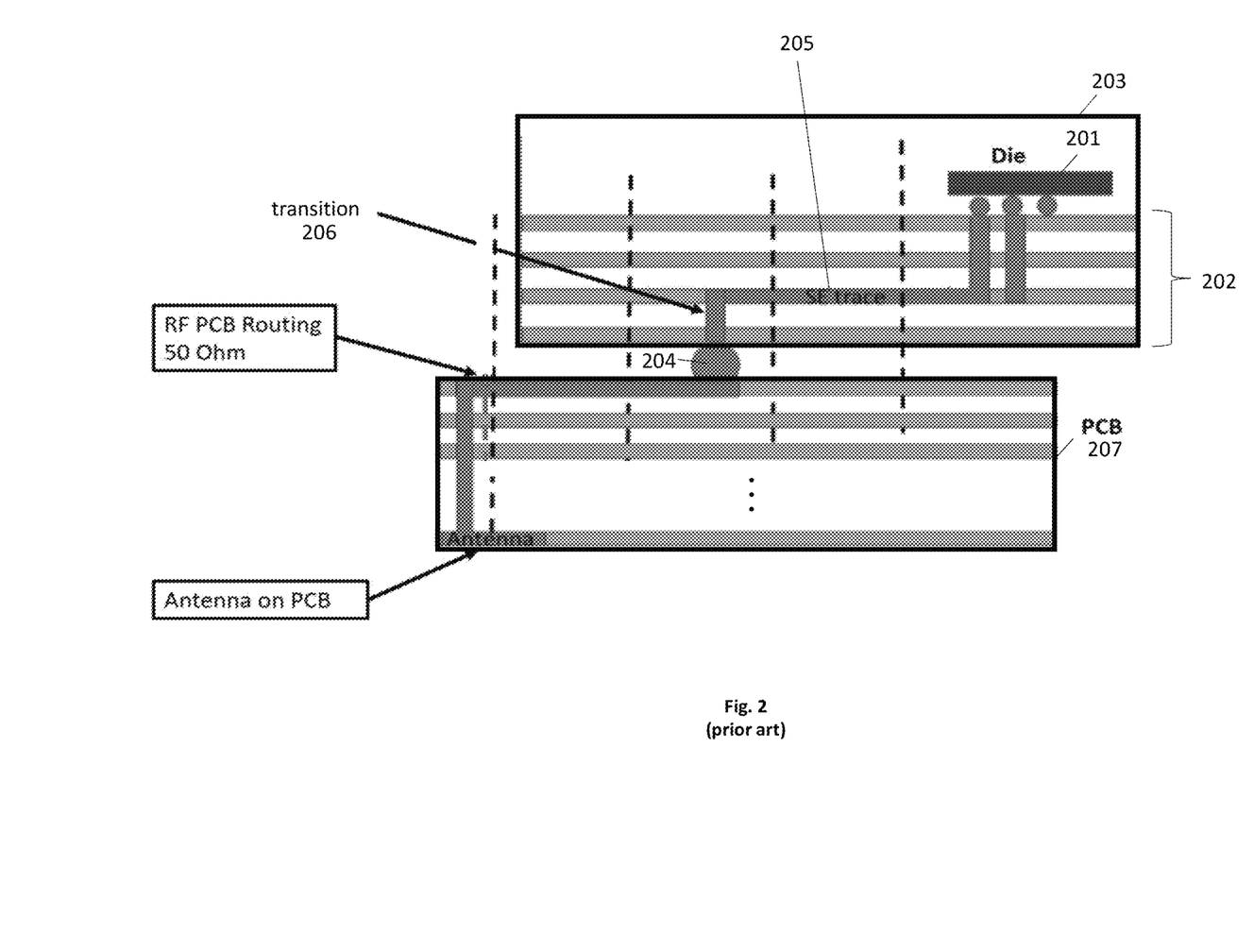
FIG. 2 shows an RF circuit die coupled to an antenna.

Preventing abrupt changes in the transmission line structure can be particularly problematic for package I/Os. FIG. 2 shows an RF circuit die 201 disposed on the substrate 202 of a semiconductor chip package 203. The package substrate 202 is composed of a first multi-layer printed circuit board 202. Solder balls 204 are formed on the underside of the package substrate 202 (for ease of drawing only one solder ball 204 is depicted). As observed in FIG. 2, a transmission line 205 emanates from the RF circuit die 201 and runs to the solder ball 204 through vertical "transition" structure 206.

The solder balls 204 on the underside of the package substrate 202 are aligned with pads that are formed on the upper surface of the second printed circuit board 207. The solder balls 204 are melted and then re-hardened resulting in the formation of electro-mechanical solder ball connections 204 between the package substrate 202 and the underlying printed circuit board 207. From the solder ball connection 204 on the second printed circuit board 207, a second transmission line runs on the second printed circuit board 207 to an antenna that is located on the opposite side of the printed circuit board 207.

In the case of signal transmission, an RF signal is sent from the RF circuit 201 along transmission line 205, through the transition 206 and solder ball 204, onto the transmission line on the second printed circuit board 207, and is launched from the antenna. In the case of reception, the reverse process takes place.

In the case of either transmission or reception, the solder ball 204 and transition 206 represents a significant deviation in structure with the transmission line 205. As such, an impedance mismatch is associated with the solder ball 204 and transition 206 that, as discussed above, can lead to loss of signal power as the signal propagates between the two printed circuit boards 202, 207.

Figure 3A:
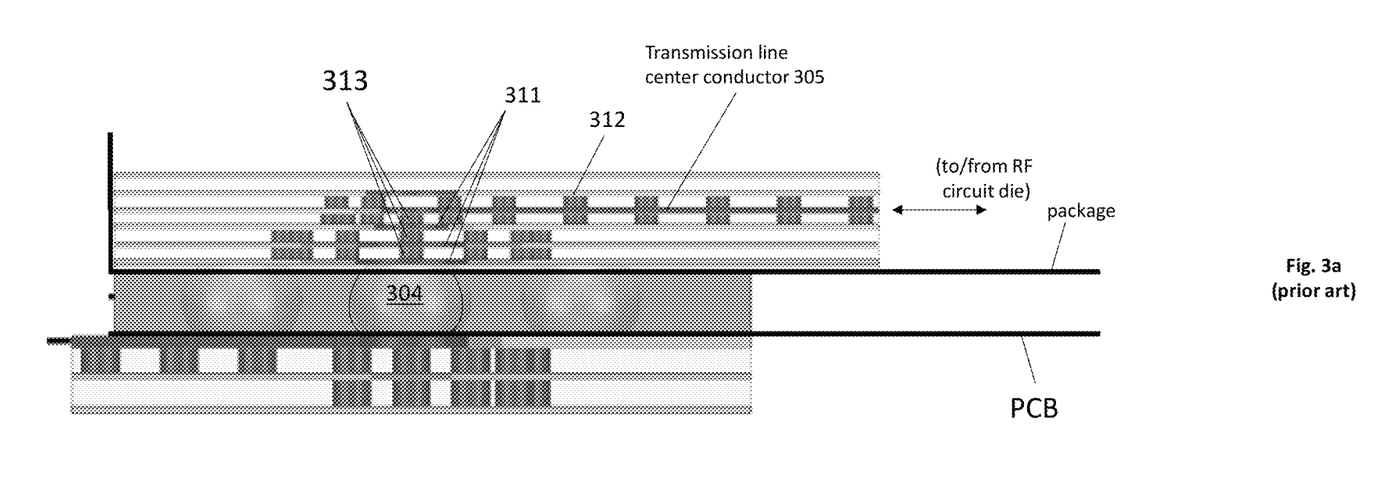
FIGS. 3a and 3b depict a prior art structure transitions between a transmission line and a solder ball.
Figure 3B:
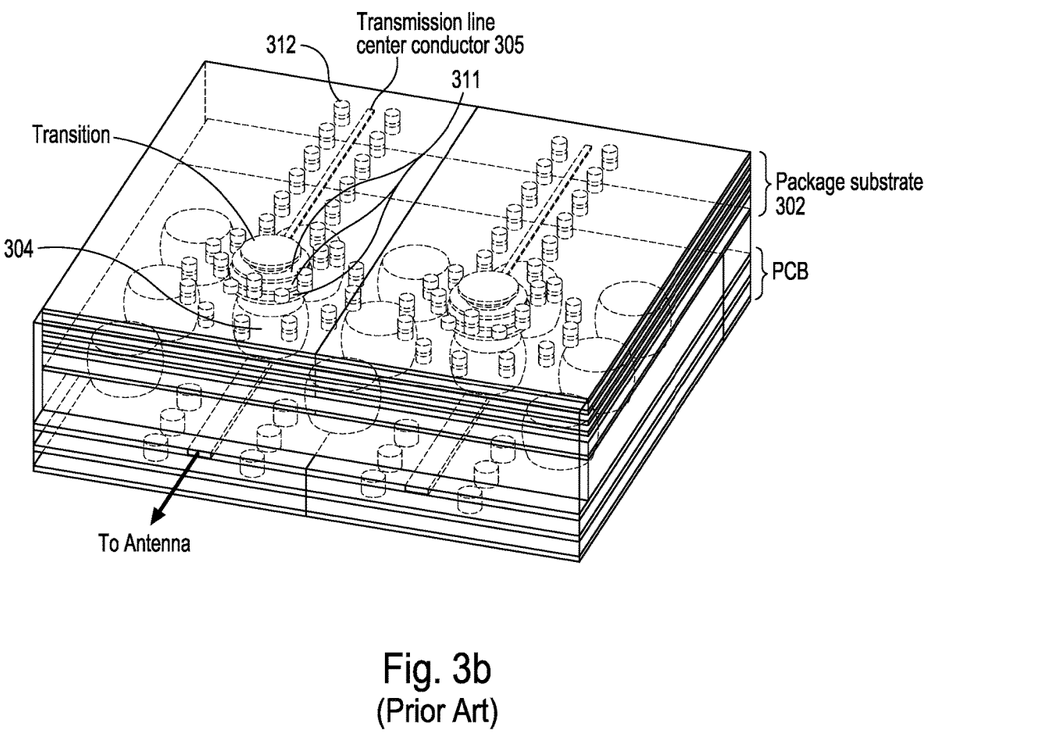

FIGS. 3a and 3b shows more detailed views of a specific prior art structure for the above described transmission line 305 to solder ball 304 transition 306. FIG. 3a shows a side view whereas FIG. 3b shows an angled view. As observed in these depictions, a series of disks 311 with varying radius are formed in the metal layers of the package substrate 302 beneath the level of the transmission line's center conductor 305 down to the solder ball 304.

The series of discs 311 are intended to gradually change the structure of the transmission line's center conductor as it drops down from the microstrip form 305 that runs along a particular metal plane of the package substrate 302 to the solder ball 304. The gradual change in center conductor structure attempts to avoid abrupt changes in characteristic impedance as the transmission line transitions from the micro-strip 305 to the solder ball 304. The plug vias 312 that surround the center conductor are grounded and form the outer conductors of the transmission line (for ease of drawing only one plug via is labeled in FIG. 3a and FIG. 3b)

Unfortunately, the signal loss through the microstrip 305 to solder ball 304 transition 306 of FIGS. 3a and 3b result in signal loss that is unfavorable for certain automotive radio detection and ranging (RADAR) applications. For example, in one implementation, within a 76 GHz to 81 GHz frequency band of interest, the insertion loss varies from –0.88 dB at 76 GHz to –0.90 dB at 81 GHz.

Figure 4A:
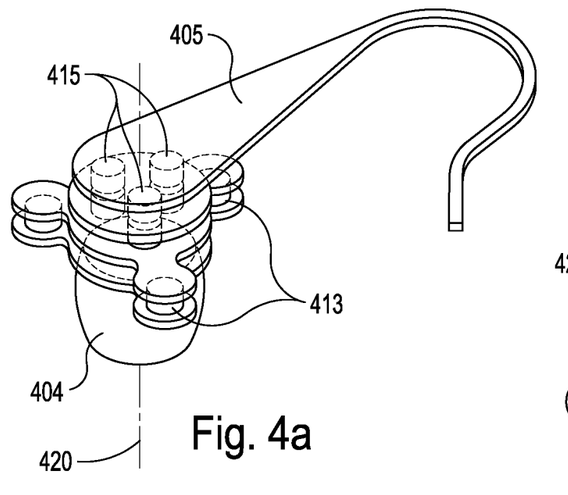
FIGS. 4a, 4b, 4c and 4d depict an improved structure that transitions between a transmission line and a solder ball.
Figure 4B:
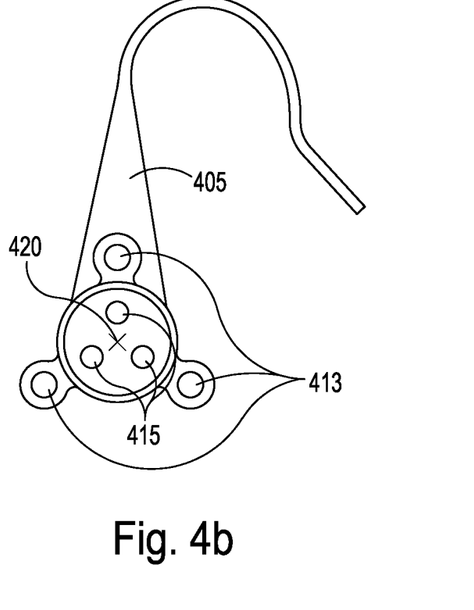
Figure 4C:
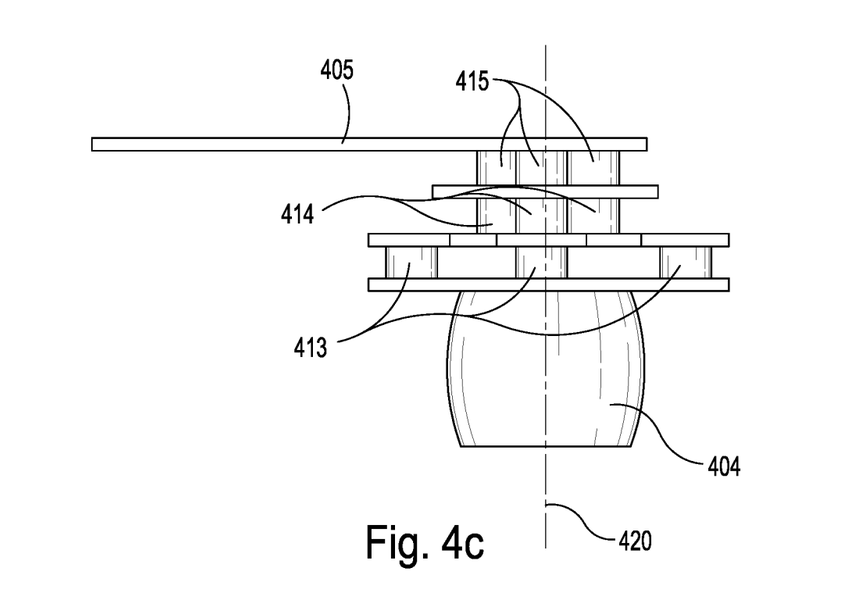
Figure 4D:
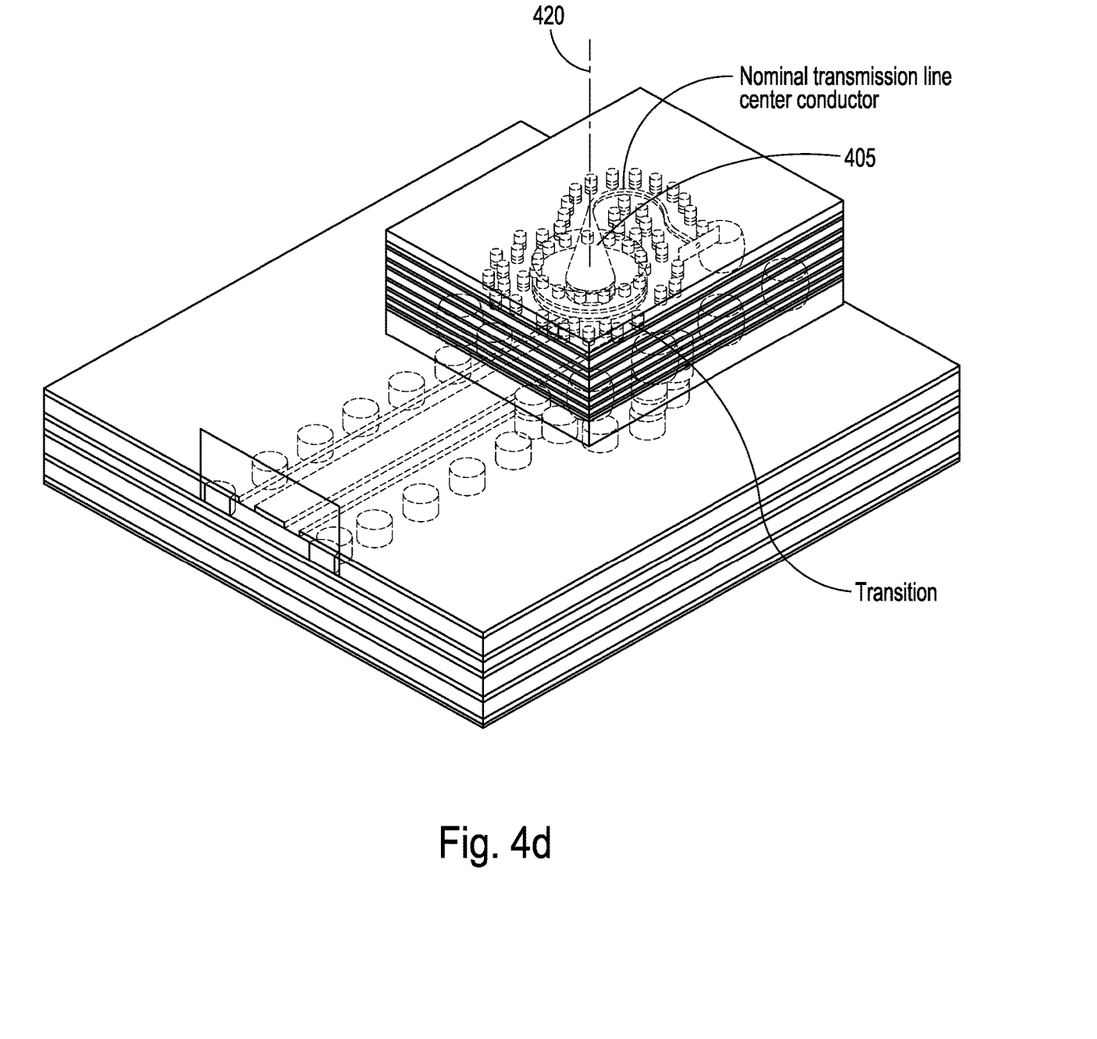

FIGS. 4a through 4d depict an improved design that incorporates a cone tapper microstrip 405 instead of the traditional rectangular micro strip as the transmission line center conductor between the RF circuit die and the transition region (FIGS. 4a and 4b depict the cone tapper microstrip 405 as being semi-transparent for illustrative ease).

Comparing the prior art approach of FIGS. 3a and 3b with the improved approach of FIGS. 4a through 4d, the sudden change from a narrow rectangular micro strip 305 to disc structures 311 in the transition region of the prior art approach introduces an abrupt change in three dimensional structure, and correspondingly characteristic impedance, that the gradual conical expansion of the cone tapper microstrip 405 in the improved approach greatly diminishes.

As such, whereas the prior art approach only attempts gradual characteristic impedance change in the vertical transition structure, by contrast, the improved approach integrates gradual characteristic impedance change not only within the transition but also with an extended run of the micro-strip that terminates at the transition.

Here, the vertical transition structure can be viewed as one large via whose characteristic impedance compares with the solder ball's while the cone tapper 405 can be viewed as a micro-strip of gradually changing characteristic impedance from that of the transmission line that emanates from the RF circuit to that of the solder ball.

Moreover, whereas the prior art structure physically connects the vertical center conductor of the transmission line through metal vias 313 that are aligned with the center of the disks 311, by contrast, the improved design of FIGS. 4a-d physically connect the center conductor in the transition more on the periphery by way of triple microvia structures 413, 414, 415. Here, with the dimensions of the structures involved and the frequencies of the signals of interest, the electrical current that passes through the inner conductor is believed to substantially remain near the outer edges ("skin-effect") of the cone tapper micro-strip 405 and the solder ball 404 rather than within their inner cores.

By constructing the inner conductor through the vertical transition with peripherally located vias 413, 414, 415 rather than centrally located vias 313, electrical current can continue to run toward through the outer edge of the middle conductor's structures rather than through its core. This introduces even more uniformity between the microstrip 405 and transition regions as compared to the prior art approach. More generally, each of the peripheral located vias 413, 414, 415 at a same layer of the substrate correspond to multiple conducting vias 413, 414, 415 that are radially arranged around a center axis 420 of the solder ball 404.

The triple microvia structures 413, 414, 415 also reduce stress on the solder ball 404 during attachment of the package substrate to the lower printed circuit board thereby improving reliability as well.

In alternate embodiments, there exists at least one level in the transition where some number other than three peripheral/radial vias are used to construct the inner conductor (e.g., 4, 5, 6, etc.).

Figure 5A:
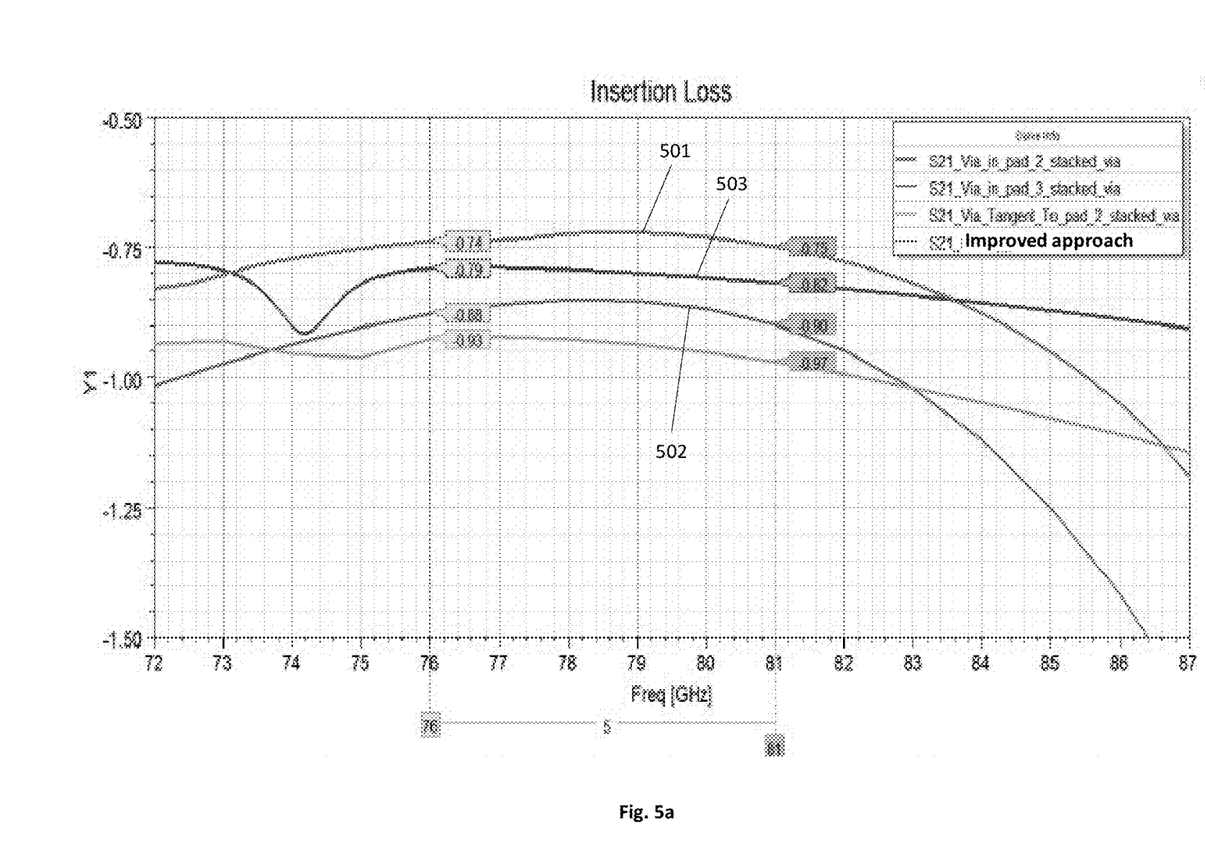
FIGS. 5a and 5b compares insertion loss and return loss for an embodiment of the improved transition structure against other transition structures.
Figure 5B:
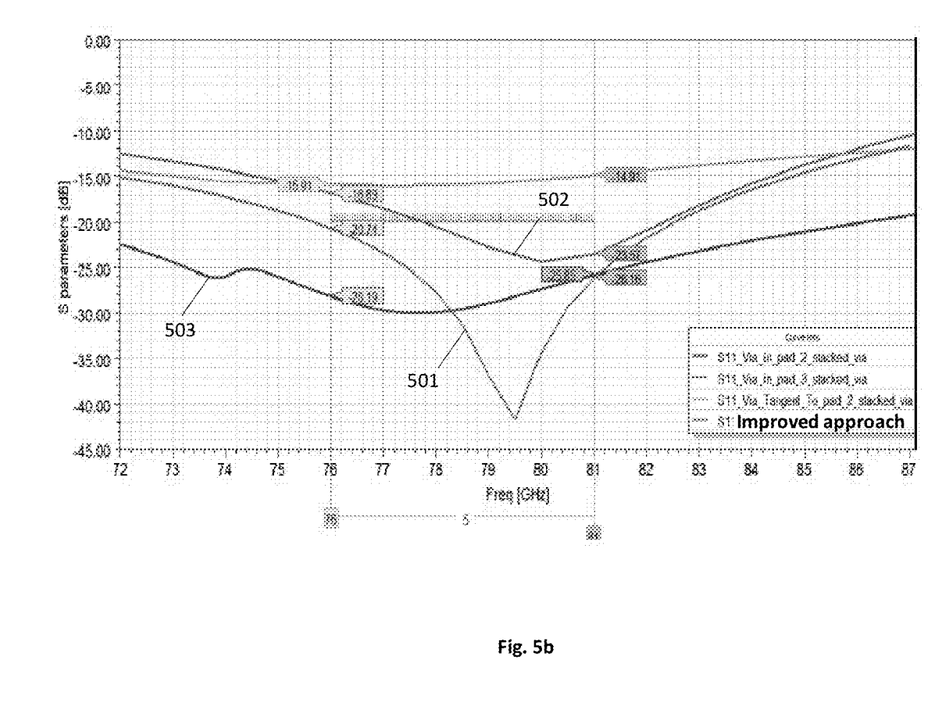

FIG. 5a shows a comparison of the return loss of the prior art structure against that of the improved structure over the aforementioned frequency range of interest. As can be seen in FIG. 5, the insertion loss for the improved structure 501 results in less insertion loss than the prior art approach 502 of FIGS. 3a and 3b and another prior approach 503 that is similar to the prior art 502 approach of FIGS. 3a and 3b but uses two instead of three stacked vias 313 in the center conduction of the transition region. FIG. 5b shows a comparison of insertion loss for the same structures.

The RF circuit die packaging approach described above is believed to be particularly useful for autonomous driving automotive RADAR applications that operate within the 76-81 GHz frequency band. In the case of autonomous driving, the RADAR is used as the eyes of the system that understands the topography and structure in front of the automobile. The RADAR's data is processed by a compute engine within the automobile to determine any steering or velocity changes of the automobile in view of the RADAR information.

Figure 6:
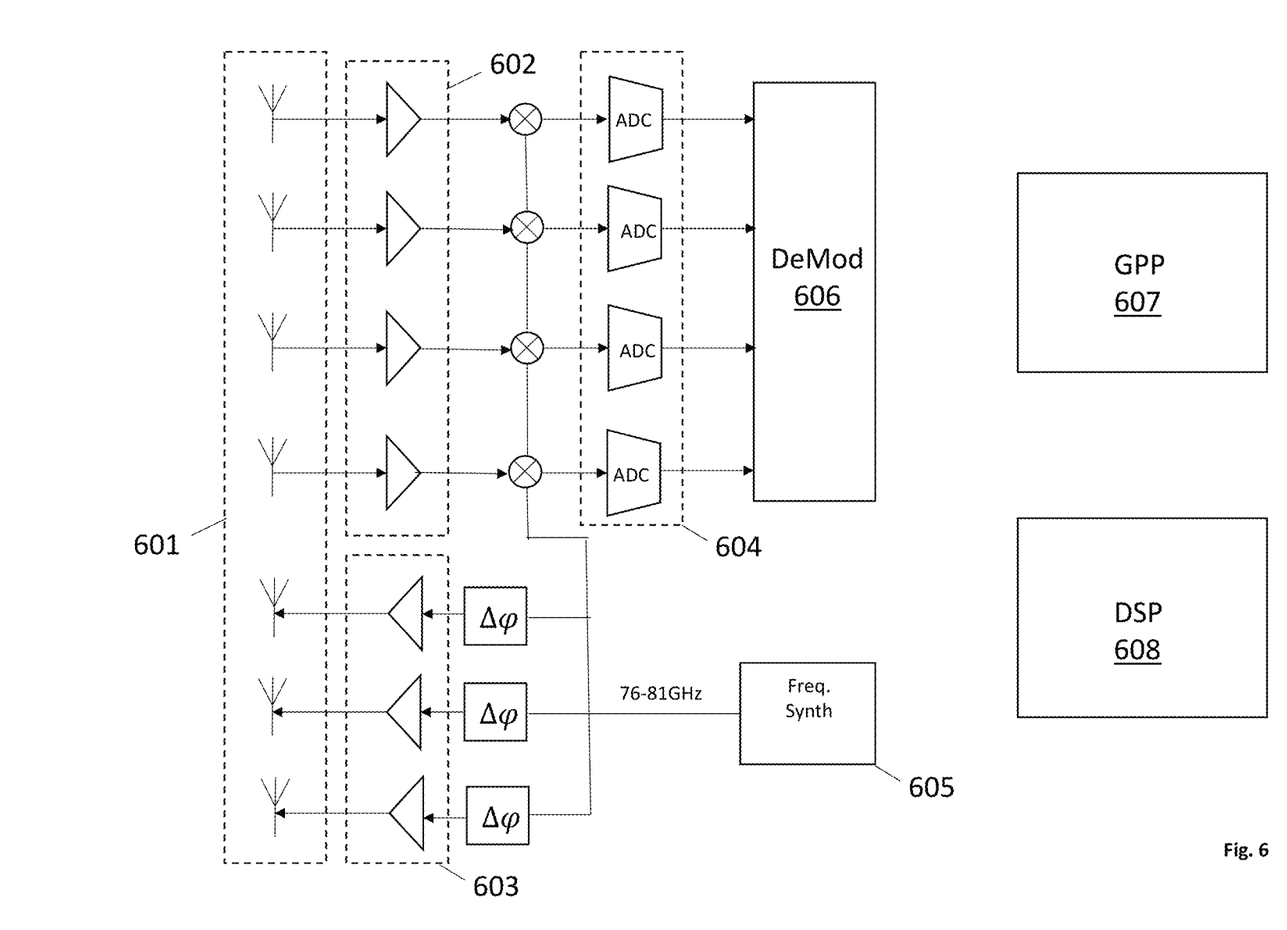
FIG. 6 shows a RADAR system.

FIG. 6 shows an exemplary RADAR system that the RF circuit die packaging approach described above can be integrated into. As observed in FIG. 6, the RADAR system includes an antenna array 601, a bank of power amplifiers 603 and bank of low noise amplifiers 602. During operation, a frequency synthesizer 605 generates a signal having a frequency component within the 76-81 GHz frequency band. The signal is phase shifted ("$\Delta\varphi$"), amplified by the power amplifiers 603 and transmitted from a set of corresponding antennas.

To the extent there are material objects in range of the RADAR system, the signals that were launched from the antennas reflect from such objects and the reflected signals are received by the antennas that are coupled to the low noise amplifiers 602. After amplification by the low noise amplifiers 602, the received signals are down converted into an intermediate frequency by a bank of mixers and demodulated by demodulator 606 (e.g., a decimation filter chain).

Signals to be transmitted and/or received signals can be further processed by a digital signal processor 608. A general purpose processor and/or microcontroller 607 oversees overall operational state of the RADAR system including overseeing communications with a larger host system within the automobile.

In various embodiments, one or more of the low noise amplifiers 602 and power amplifiers 603 are integrated in a package having aspects of the improved transmission line structure described above with respect to FIGS. 4a through 4d. The package has, e.g., a ball grid array that are coupled to a printed circuit board having the respective antenna(s) that the amplifier(s) are coupled to.

The larger host system can be implemented as a computer system or includes various components of a computer system 700 as described immediately below with respect to FIG. 7. Moreover, although the above transition structure has been described in relation to a RADAR system, it is conceivable that the signal frequencies associated with packaged semiconductor chips in general computer systems (e.g., that are relevant for sharp pulse shaped waveforms), such I/O signals of high performance logic chips (e.g., processor chips, accelerator chips, networking chips, etc.), can make use of the teachings above. For example, the aforementioned RF circuit die can be replaced by a high performance logic chip and the underlying (second) printed circuit board can be the motherboard of a basic computing system or the printed circuit board of a module that plugs into the motherboard of a basic computing system. As such, the transition structure described above can be applied to package I/Os of logic chips in basic computers.

Figure 7:
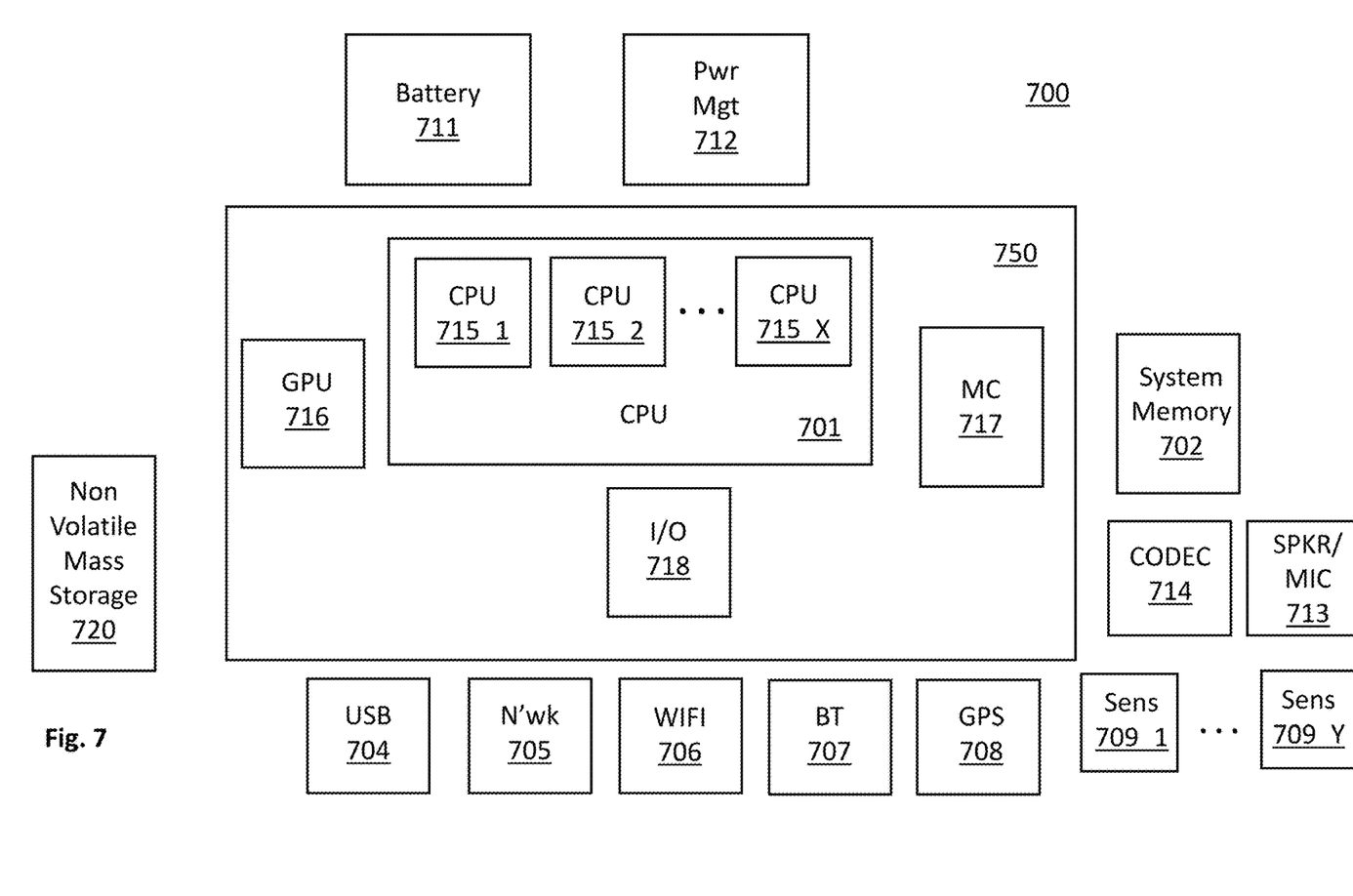
FIG. 7 shows a computer system.

As observed in FIG. 7, the basic computing system 700 may include a central processing unit (CPU) 701 (which may include, e.g., a plurality of general purpose processing cores 715_1 through 715_X) and a main memory controller 717 disposed on a multi-core processor or applications processor, main memory 702 (also referred to as "system memory"), a display 703 (e.g., touchscreen, flat-panel), a local wired point-to-point link (e.g., universal serial bus (USB)) interface 704, a peripheral control hub (PCH) 718; various network I/O functions 705 (such as an Ethernet interface and/or cellular modem subsystem), a wireless local area network (e.g., WiFi) interface 706, a wireless point-to-point link (e.g., Bluetooth) interface 707 and a Global Positioning System interface 708, various sensors 709_1 through 709_Y, one or more cameras 710, a battery 711, a power management control unit 712, a speaker and microphone 713 and an audio coder/decoder 714.

An applications processor or multi-core processor 750 may include one or more general purpose processing cores 715 within its CPU 701, one or more graphical processing units 716, a main memory controller 717 and a peripheral control hub (PCH) 718 (also referred to as I/O controller and the like). The general purpose processing cores 715 typically execute the operating system and application software of the computing system. The graphics processing unit 716 typically executes graphics intensive functions to, e.g., generate graphics information that is presented on the display 703. The main memory controller 717 interfaces with the main memory 702 to write/read data to/from main memory 702. The power management control unit 712 generally controls the power consumption of the system 700. The peripheral control hub 718 manages communications between the computer's processors and memory and the I/O (peripheral) devices.

Each of the touchscreen display 703, the communication interfaces 704-707, the GPS interface 708, the sensors 709, the camera(s) 710, and the speaker/microphone codec 713, 714 all can be viewed as various forms of I/O (input and/or output) relative to the overall computing system including, where appropriate, an integrated peripheral device as well (e.g., the one or more cameras 710). Depending on implementation, various ones of these I/O components may be integrated on the applications processor/multi-core processor 750 or may be located off the die or outside the package of the applications processor/multi-core processor 750. The computing system also includes non-volatile mass storage 720 which may be the mass storage component of the system which may be composed of one or more non-volatile mass storage devices (e.g. hard disk drive, solid state drive, etc.). The non-volatile mass storage 720 may be implemented with any of solid state drives (SSDs), hard disk drive (HDDs), etc.

Embodiments of the invention may include various processes as set forth above. The processes may be embodied in program code (e.g., machine-executable instructions). The program code, when processed, causes a general-purpose or special-purpose processor to perform the program code's processes. Alternatively, these processes may be performed by specific/custom hardware components that contain hard wired interconnected logic circuitry (e.g., application specific integrated circuit (ASIC) logic circuitry) or programmable logic circuitry (e.g., field programmable gate array (FPGA) logic circuitry, programmable logic device (PLD) logic circuitry) for performing the processes, or by any combination of program code and logic circuitry.

Elements of the present invention may also be provided as a machine-readable medium for storing the program code. The machine-readable medium can include, but is not limited to, floppy diskettes, optical disks, CD-ROMs, and magneto-optical disks, FLASH memory, ROMs, RAMs, EPROMs, EEPROMs, magnetic or optical cards or other type of media/machine-readable medium suitable for storing electronic instructions.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a semiconductor chip package substrate comprising a transmission line having a conductor to conduct current of a signal that is propagated along the transmission line, the conductor having an expanding width as the conductor approaches a vertical transition region, the vertical transition region between the conductor and a solder ball, the vertical transition region comprising multiple conducting vias at a same layer of the semiconductor chip package substrate, the multiple conducting vias electrically connected to the conductor, the multiple conducting vias radially arranged around a center axis of the solder ball.

2. The apparatus of claim 1 wherein the signal is to have a frequency within a frequency band of 76-81 GHz.

3. The apparatus of claim 1 further comprising a second set of multiple conducting vias that are electrically connected to the conductor, the second set of multiple conducting vias radially arranged around the center axis of the solder ball.

4. The apparatus of claim 3 wherein the second set of multiple conducting vias are radially arranged around the center axis of the solder ball at greater radius than the multiple conducting vias.

5. The apparatus of claim 3 wherein the second set of multiple conducting vias are between the multiple conducting vias and the solder ball.

6. The apparatus of claim 1 wherein a radio frequency (RF) circuit die is mounted to a first surface of the semiconductor chip package substrate and is coupled to the conductor.

7. The apparatus of claim 6 wherein the solder ball is on a second surface of the semiconductor chip package substrate that is opposite the first surface.

8. An electronic system, comprising:
a semiconductor chip package comprising a radio frequency (RF) circuit die mounted to a package substrate, the package substrate comprising a transmission line having a conductor to conduct current of a signal that is propagated along the transmission line, the conductor having an expanding width as the conductor approaches a vertical transition region, the vertical transition region between the conductor and a solder ball, the vertical transition region comprising multiple conducting vias at a same layer of the semiconductor chip package substrate, the multiple conducting vias electrically connected to the conductor, the multiple conducting vias radially arranged around a center axis of the solder ball; and a printed circuit board coupled to the solder ball, an antenna on the printed circuit board, the antenna coupled to the solder ball.

9. The electronic system of claim 8 wherein the signal is to have a frequency within a frequency band of 76-81 GHz.

10. The electronic system of claim 8 further comprising a second set of multiple conducting vias that are electrically connected to the conductor, the second set of multiple conducting vias radially arranged around the center axis of the solder ball.

11. The electronic system of claim 10 wherein the second set of multiple conducting vias are radially arranged around the center axis of the solder ball at greater radius than the multiple conducting vias.

12. The electronic system of claim 10 wherein the second set of multiple conducting vias are between the multiple conducting vias and the solder ball.

13. The electronic system of claim 8 wherein the RF circuit die is to send a signal to the antenna.

14. The electronic system of claim 8 wherein the RF circuit die is to receive a signal from the antenna.

15. An apparatus, comprising:

A radio detection and ranging (RADAR) system, comprising:

a semiconductor chip package comprising a radio frequency (RF) power amplifier mounted to a package substrate, the package substrate comprising a transmission line having a conductor to conduct current of a signal that is propagated along the transmission line, the conductor having an expanding width as the conductor approaches a vertical transition region, the vertical transition region between the conductor and a solder ball, the vertical transition region comprising multiple conducting vias at a same layer of the semiconductor chip package substrate, the multiple conducting vias electrically connected to the conductor, the multiple conducting vias radially arranged around a center axis of the solder ball; and a printed circuit board coupled to the solder ball, an antenna on the printed circuit board, the antenna coupled to the solder ball, the antenna to launch a RADAR signal generated by the RF power amplifier.

16. The apparatus of claim 15 wherein the signal is to have a frequency within a frequency band of 76-81 GHz.

17. The apparatus of claim 15 further comprising a second set of multiple conducting vias that are electrically connected to the conductor, the second set of multiple conducting vias radially arranged around the center axis of the solder ball.

18. The apparatus of claim 17 wherein the second set of multiple conducting vias are radially arranged around the center axis of the solder ball at greater radius than the multiple conducting vias.

19. The apparatus of claim 17 wherein the second set of multiple conducting vias are between the multiple conducting vias and the solder ball.

20. The apparatus of claim 15 wherein the RADAR system is integrated within an automobile.

* * * * *